United States Patent
Bussy et al.

(10) Patent No.: US 11,913,983 B2
(45) Date of Patent: Feb. 27, 2024

(54) METHOD FOR ARC DETECTION BY MULTI-CARRIER REFLECTOMETRY (MCTDR)

(71) Applicant: Safran Electrical & Power, Blagnac (FR)

(72) Inventors: Emmanuel Bussy, Moissy-Cramayel (FR); Sylvain Poignant, Moissy-Cramayel (FR); Marc Olivas, Orsay (FR); Patrick Depras, St Grégoire (FR); Soumaya Sallem Andasmas, Savigny sur Orge (FR)

(73) Assignees: SAFRAN ELECTRICAL & POWER, Blagnac (FR); WIN MS, Orsay (FR)

( * ) Notice: Subject to any disclaimer, the term of this patent is extended or adjusted under 35 U.S.C. 154(b) by 0 days.

(21) Appl. No.: 17/439,320

(22) PCT Filed: Mar. 16, 2020

(86) PCT No.: PCT/HR2020/050544
§ 371 (c)(1),
(2) Date: Sep. 14, 2021

(87) PCT Pub. No.: WO2020/188209
PCT Pub. Date: Sep. 24, 2020

(65) Prior Publication Data
US 2022/0155360 A1    May 19, 2022

(30) Foreign Application Priority Data
Mar. 15, 2019 (FR) .................................. FR1902721

(51) Int. Cl.
*G01R 31/00* (2006.01)
*G01R 31/11* (2006.01)

(52) U.S. Cl.
CPC ............ *G01R 31/008* (2013.01); *G01R 31/11* (2013.01)

(58) Field of Classification Search
CPC .............................. G01R 31/008; G01R 31/11
See application file for complete search history.

(56) References Cited

FOREIGN PATENT DOCUMENTS

| | | |
|---|---|---|
| EP | 2 706 636 A1 | 3/2014 |
| FR | 3 060 128 A1 | 6/2018 |
| GB | 1 508 352 A | 4/1978 |

OTHER PUBLICATIONS

Wire Arc defect localization and mathematical characterization by MCTDR reflectometry; Soumaya Sallem 2017 (Year: 2017) (Year: 2017).*

(Continued)

*Primary Examiner* — Farhana A Hoque
(74) *Attorney, Agent, or Firm* — BIRCH, STEWART, KOLASCH & BIRCH, LLP

(57) ABSTRACT

The invention relates to a method for detecting and locating a fault by reflectometry in an electrical circuit, such a method comprising the steps of: —emitting a reflectometry signal in a line of the circuit to be studied; —acquiring an electrical variable of the reflected signal passing through the network; —filtering the acquired signal so as to eliminate signals having a frequency lower than a cutoff frequency, the cutoff frequency having a value between 100 kHz and 1 GHz; —analysing an acquired signal so as to detect a fault.

6 Claims, 5 Drawing Sheets

(56) References Cited

OTHER PUBLICATIONS

Lelong et al., "On Line Wire Diagnosis using Multicarrier Time Domain Reflectometry for Fault Location," IEEE Sensors 2009 Conference, Piscataway, N.J., USA, 2009, 4 pages total.
Sallem et al., "Wire arc defect localization and mathematical characterization by MCTDR reflectometry," 2017 IEEE Autotestcon, IEEE, 2017, 6 pages total.

* cited by examiner

METHOD FOR ARC DETECTION BY MULTI-CARRIER REFLECTOMETRY (MCTDR)

GENERAL TECHNICAL FIELD AND PRIOR ART

The invention relates to the general field of Multi Carrier Time Domain Reflectometry MCTDR methods, in particular the methods for detecting an electric arc in an electric circuit.

In constrained environments, in particular in the avionics systems, the increase in the on-board power levels increases the wiring density and therefore the risks of electric arcs.

On conventional networks, made up of AC voltage networks (typically 115/230 V), the transitions of the voltage to 0 volts are favorable to the extinction of the arcs. In DC voltage networks (typically with a voltage level of 28 V), the transported power does not promote the creation and the dangerousness of the electric arcs.

In case of increase in these voltage levels and/or the choice of a transition into DC voltage, this significantly increases the risk of electric arcing, in particular due to the proximity of the cables relative to each other.

The state of the art of the active detection systems marketed or simply studied shows weaknesses in the levels of reliability of detection of the electric arcs and of robustness relative to the environment.

The reliability is the major criterion for acceptability of an active detection system. It must be able to detect all types of electric arcs:
- parallel and series arcs,
- arcs of different powers,
- arcs of different durations,
- whatever their positions on the electricity network.

The series arc generally occurs on an interface between two conductors (connectors, contacts, lugs). It happens subsequently to a manufacturing or mounting defect or during a maintenance operation.

For the usual diagnostic means, the problem with the series arc lies in the fact that its current or voltage signature is very slight (on a current or voltage curve).

Indeed, the electric arc behaves like low impedance added in series on a power distribution line.

This results in a slight current decrease seen by the cut-off device.

Simple monitoring (low frequencies) of the current does not allow detecting the series arc because it does not exceed the current detection template of the conventional protection systems.

Many reflectometry methods have been proposed in order to detect the electric arcs, capable of detecting slow or fast local impedance variations. One such method consists of injecting a signal into a cable and then of detecting the waves reflected on the different characteristic impedance discontinuities.

The series arc fault being low in impedance variation and therefore in amplitude on the reflectogram, it is necessary to lower the detection thresholds to detect it.

Indeed, the series arc diagnosis requires finer setting of the detection thresholds because the fault to be detected is lower than the parallel arc. A major problem appears: at these detection levels, 90% of the reflectograms obtained are noisy at the time of the arcing.

Indeed, the electric arc phenomenon generates broadband impulse noise on the monitored cables.

This noise is characterized by its spectral density and its frequency band. The latter being very close to that of the reflectometry acquisition system, the noise saturates the input stage of the detection system.

Among the various methods proposed, a conventionally used electric arc detection solution utilizes the MCTDR (Multi Carrier Time Domain Reflectometry) technology.

This technology is for example described in detail in the application WO2016192980.

GENERAL PRESENTATION OF THE INVENTION

One aim of the invention is to allow a series arc or parallel arc detection.

Another aim of the invention is to allow the location of an arc.

Another aim of the invention is to limit the impact of noise on the measurement.

Another aim is to avoid the constant transmission of a reflectometry signal.

Another aim of the invention is to avoid transmitting a reflectometry signal in unnecessary frequencies.

To this end, the invention proposes a method for detecting and locating a fault by reflectometry in an electric circuit, such a method including the steps of:
- Transmitting a reflectometry signal in a line of the circuit to be studied;
- Acquiring an electrical quantity of the reflected signal passing through the network;
- filtering the acquired signal so as to eliminate signals having a frequency lower than a cut-off frequency, the cut-off frequency having for example a value between a few tens of kHz and a few hundred MHz;
- Analyzing an acquired signal so as to detect a fault.

The transmitted signal is a Multi Carrier Time Domain Reflectometry MCTDR signal.

In addition, the analysis includes a comparison of the acquired signal with a first and a second threshold, this first and this second threshold being of different signs.

In this way, an optimal detection and location of a parallel or series electric arc in an aeronautical environment with an MCTDR reflectometry system is ensured.

The use of two thresholds with different signs (specific negative threshold related to the series arc and another specific positive threshold related to the parallel arc) indeed allows detecting both a series arc and a parallel arc, which is never possible with a single threshold.

Advantageously, such a method is supplemented by the following characteristics, taken alone or in combination:
- the analysis step includes a comparison of the acquired signal with a first threshold and a second threshold, the first threshold having a value between 0 and the negative of the second threshold;
- the signal transmission step is carried out by injecting into the circuit a signal including frequencies greater than the cut-off frequency (N); According to another aspect, the circuit is supplied with an AC voltage signal, the voltage assumes a zero value at each period, and the step of transmitting a reflectometry signal is configured to transmit a high-frequency pattern around the time when the voltage measured between the two diagnosed conductors assumes a zero value.

According to another aspect, the invention proposes a device for detecting and locating a series arc by reflectometry configured to carry out a method according to the invention, in which the device includes:

a coupling element configured to transmit and acquire an electrical signal in the circuit and to acquire a signal passing through the circuit;

a high-pass filter having a cut-off frequency, the high-pass filter being configured to block the frequencies lower than the cut-off frequency;

a correlation chip able to control the coupling module and the high-pass filter, the correlation chip including a memory in which code data are stored, the code data including signal processing algorithms configured to carry out a method according to the invention.

Optionally but advantageously, in such a device, the high-pass filter is disposed between the line and the other elements of the device.

Optionally but advantageously, in such a device, the high-pass filter and the coupling element are produced by means of a single capacitive coupling.

According to another aspect, the invention proposes a computer program product including code data which, when executed by a computing unit, allow the implementation of a method according to the invention.

PRESENTATION OF THE FIGURES

Other characteristics and advantages of the invention will emerge from the following description, which is purely illustrative and not limiting, and which should be read in relation to the appended figures in which.

DESCRIPTION OF ONE OR SEVERAL MODES OF IMPLEMENTATION AND EMBODIMENTS

Overviews

Figure 1:
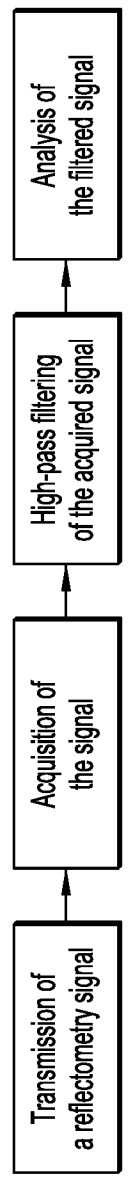
FIG. 1 is a block diagram representation sequentially representing the steps of a method in accordance with the invention.

A method for detecting and locating by reflectometry an arc in an electric circuit includes the steps illustrated in FIG. 1 of:

S1: Transmitting a reflectometry signal in a line of the circuit to be studied, the reflectometry signal being an MCTDR diagnostic signal.

It is recalled here that an MCTDR reflectometry signal is a sum of a finite number of sinusoids at a given set of frequencies, chosen outside the operating frequencies of the system under test.

For an example of MCTDR operation, reference can advantageously be made to the application WO2016192980.

S2: Acquiring an electrical quantity of the signal passing through the network; the electrical quantity can be, for example, an intensity, a voltage level, and can be acquired continuously; a point impedance variation in the circuit will cause a reflection of the signal, the reflected signal being also acquired;

S3: Filtering the acquired signal so as to eliminate signals having a frequency lower than a cut-off frequency (N), the cut-off frequency (N) having a value between 100 kHz and 1 GHz, or preferably between a few tens of kHz and a few hundreds of MHz;

S4: Analyzing the signal acquired so as to detect a fault; the acquisition of the reflected signal allows detecting an impedance variation in the circuit, also determining the position of this impedance variation by studying the duration between the transmission of a pattern and the acquisition of the reflected pattern and finally characterizing the type of fault encountered (Short-Circuit, Open Circuit, Parallel Arc, Series Arc).

This analysis includes particularly a comparison of the signal acquired with a first and a second threshold, this first and this second threshold being of different signs so as to allow a detection of both a series arc and a parallel arc.

Filtering of the Signals Entering the Detection System Below a Frequency N

Figure 2:
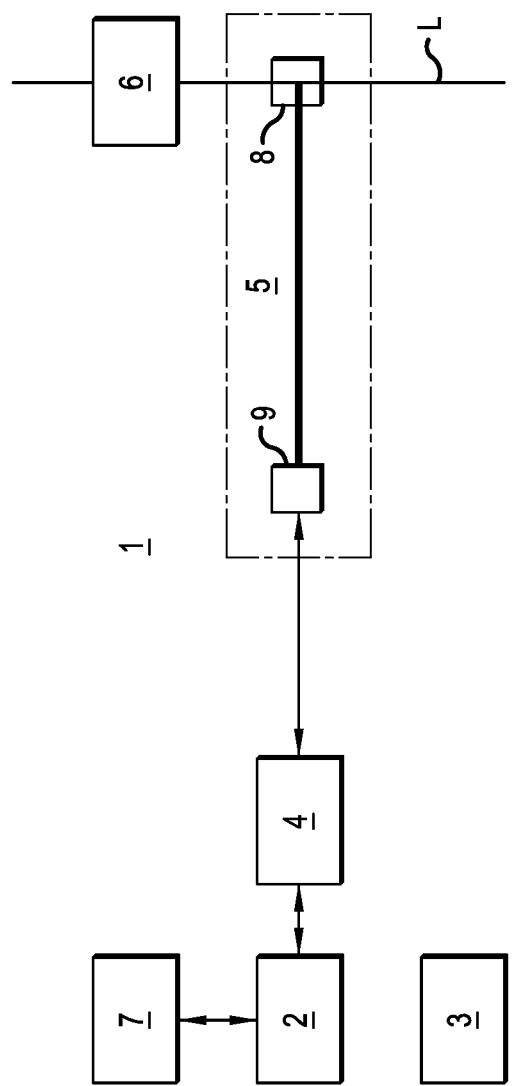
FIG. 2 is a schematic representation of a reflectometry device allowing the implementation of an arc detection method according to the invention.

The reflectometry detection method is in particular carried out by means of a device 1 for detecting and locating a series arc by reflectometry on an electric line L, shown in FIG. 2.

In one embodiment, the device 1 for detecting and locating a series arc by reflectometry includes the following elements:

A correlation chip 2 including a memory 3 in which code data are stored, the code data including signal processing algorithms allowing the correlation of the signals and the diagnosis of detection/location of the faults encountered on the monitored line;

A conversion element 4 including an analog/digital converter (ADC) and a digital/analog converter (DAC);

A coupling block 5 that allows:

Coupling the High Frequency signals from the DAC on the monitored line,

Decoupling the High Frequency signals from the monitored line to the ADC,

Protecting the digital system (converters and smart digital chip) from the voltages of the network of the line under study, A decoupling block 6 for decoupling the High Frequency signals placed on one side of the monitored line L in order to promote the sending of the High Frequency signals to the other side of the line L, An interface 7 that allows monitoring in real-time the diagnosis of the line and displays the fault detection and location information.

Such a device 1 is typically configured to inject a signal into the line L under study, and to detect the reflected signals by the impedances distributed along the line L, in particular by means of a coupling element 8 located at the interface of the line L and of the device 1.

The coupling element 8 may include a capacitive coupling, which has advantages in terms of cost and simplicity of implementation over other types of couplings.

During electric arc tests, it has been shown that electromagnetic noise inherent in the arc interfered with the reflected High Frequency data entering the detection device 1.

When an electric arc occurs, conducted electrical transients travel up through the coupling block 5 to the ADC of the converter element 4.

The latter then goes into saturation.

The correlation stage, in particular the correlation chip 2, is then impacted and the result in the form of a reflectogram presents a periodic signal whose amplitude exceeds the thresholds set for the diagnosis of the arc. Under these conditions, the electric arc is well detected but no complementary post-processing (such as the location of the fault) is possible.

In one embodiment, the device 1 includes a high-pass filter 9 having a cut-off frequency N, the high-pass filter 9 being configured to block frequencies lower than the cut-off frequency N.

In one embodiment, the cut-off frequency N can be on the order of MegaHertz ($10^6$ Hz), preferably between 10 MHz and 100 MHz, for example 30 MHz or below. The value of 30 MHz is directly related to the intrinsic parameters of the parallel and series arc in the aeronautical environment for a detection by MCTDR reflectometry. A filtering at or below this value optimizes the detection reliability of the MCTDR reflectometer.

This allows specifying the frequency band essential for the detection of the electric arcs, in particular the series arcs.

Since the device 1 performs a filtering of the signals having frequencies lower than the cut-off frequency N, it is therefore unnecessary to inject the signal below this frequency. Thus, the decrease in the used frequency band will have two positive consequences:
- Decrease in the frequency occupancy in order to promote other systems that can utilize the frequencies lower than the cut-off frequency N;
- Decrease in the occupancy of the digital components generating the reflectometry signals, which allows decreasing the number of calculation components and reducing the time it takes to send reflectometry patterns.

Since the signals injected below the cut-off frequency N are filtered on the receiving stage, there is no need to transmit them. Thus, the reduction of the band to be injected allows indirectly decreasing the time required to send a complete series of patterns.

This allows in particular detecting the even shorter faults. Indeed, the MCTDR (Multi Carrier Time Domain Reflectometry) reflectometry performs an averaging of several patterns over a determined period of time. If the number of averages remains the same but the pattern sending time is decreased by eliminating unutilized frequencies, then the detection performances will be directly improved.

In one embodiment, the high-pass filter 9 is disposed between the conversion block 4 and the line L. In this way, this allows limiting or attenuating the circulation of a signal to frequencies lower than the cut-off frequency N from the line L to the conversion unit 4, and the correlation chip 2. This allows in particular limiting the consumption of computing and energy resources of these elements, while avoiding allocating these resources to unnecessary tasks.

In one embodiment, the coupling block 5 includes only a single element, for example a capacitive coupling, which performs the high-pass filter 9 and coupling element 8 functions. This allows limiting the cost of the device, and the risks of breakdowns by limiting the number of components.

Detection Threshold Adaptation

Previously, it was mentioned that the arc behaves like a low impedance. When it is in series on the line, the measured mismatch is therefore low. In the case of a parallel arc, it is the opposite because the low impedance is added in parallel to the line load.

The impedance mismatch is very strong and the peak on the reflectogram much sharper.

Also, this peak has negative amplitude unlike that of the series arc.

Figure 3A:
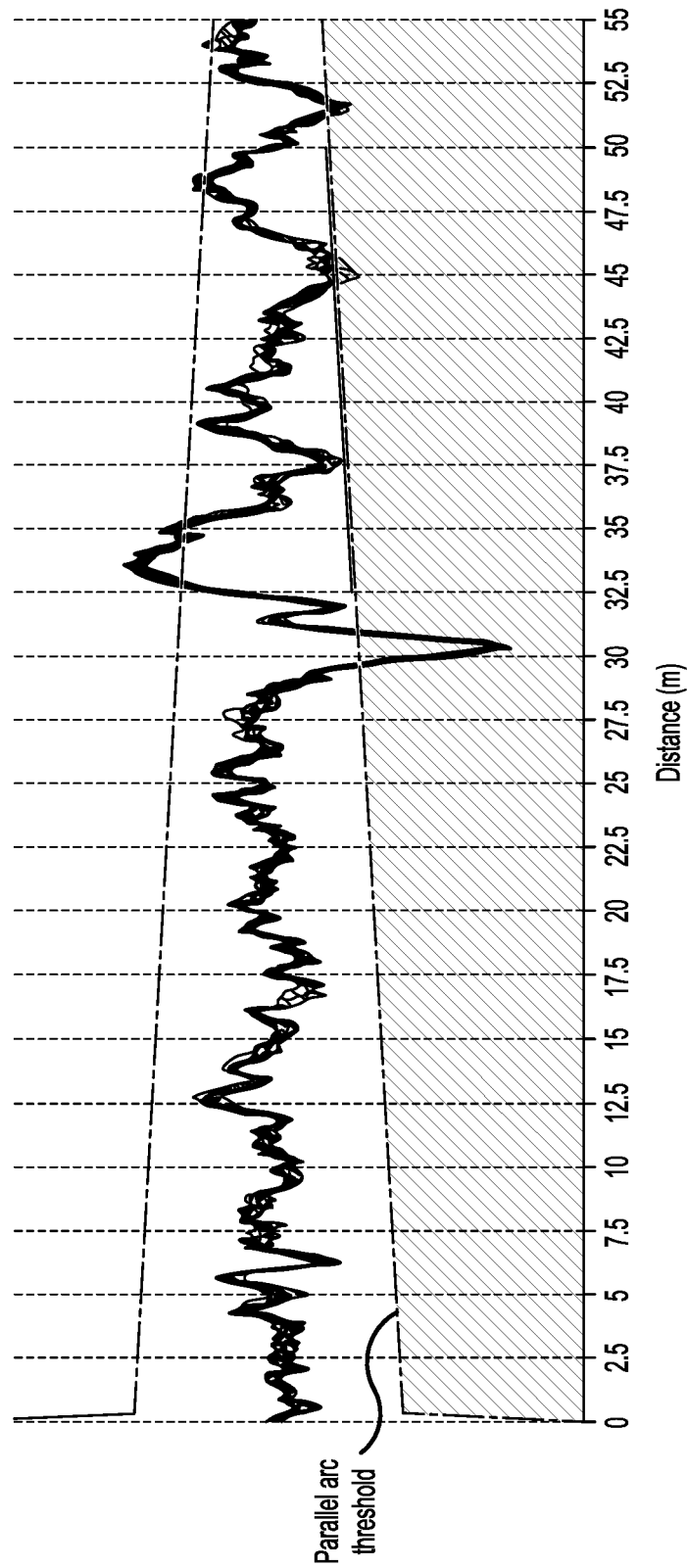
FIG. 3a is a representation of an electrical quantity reading highlighting a situation in which a detection threshold of a parallel arc is exceeded.

FIG. 3a shows an example of acquisition of a batch of parallel arcs.

Figure 3B:
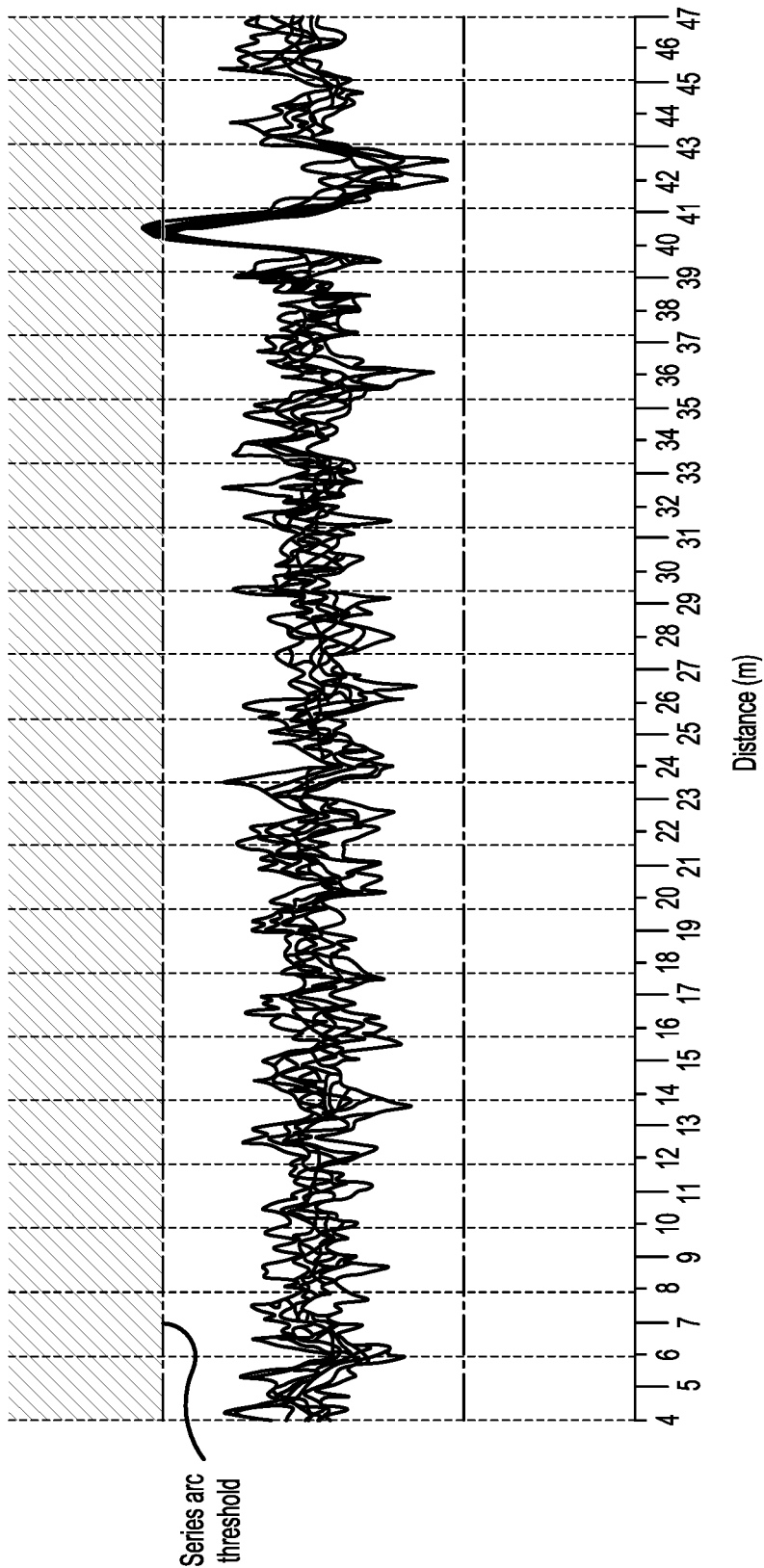
FIG. 3b is a representation of an electrical quantity reading highlighting a situation in which a detection threshold of a series arc is exceeded.

In this example, the detection threshold of the parallel arcs is negative and decreasing as a function of the length of the line (on the abscissa). Likewise, FIG. 3b shows an example of acquisition of a series of series arcs. In this example, the detection threshold of the series arcs is positive and is constant throughout the line.

In one embodiment, a reduction coefficient of the amplitude of the series arc threshold relative to that of the parallel arc threshold can be applied.

In one embodiment, there would then be:

$$Series\_arc\_threshold = H \times Parallel\_arc\_threshold$$

Where H is a value between 0 and −1 and Parallel_arc_threshold is negative.

These concepts are applicable whatever the profile of the threshold (fixed, decreasing or more complex).

AC Voltage Synchronization

One of the conditions for maintaining the electric arc is to maintain a level of network voltage higher than the arc voltage.

In the case of an alternative network, the voltage goes through 0V every ½ periods. A series arc applied on such a sinusoidal network is therefore no longer maintained for short time windows around the 0V.

Figure 4:
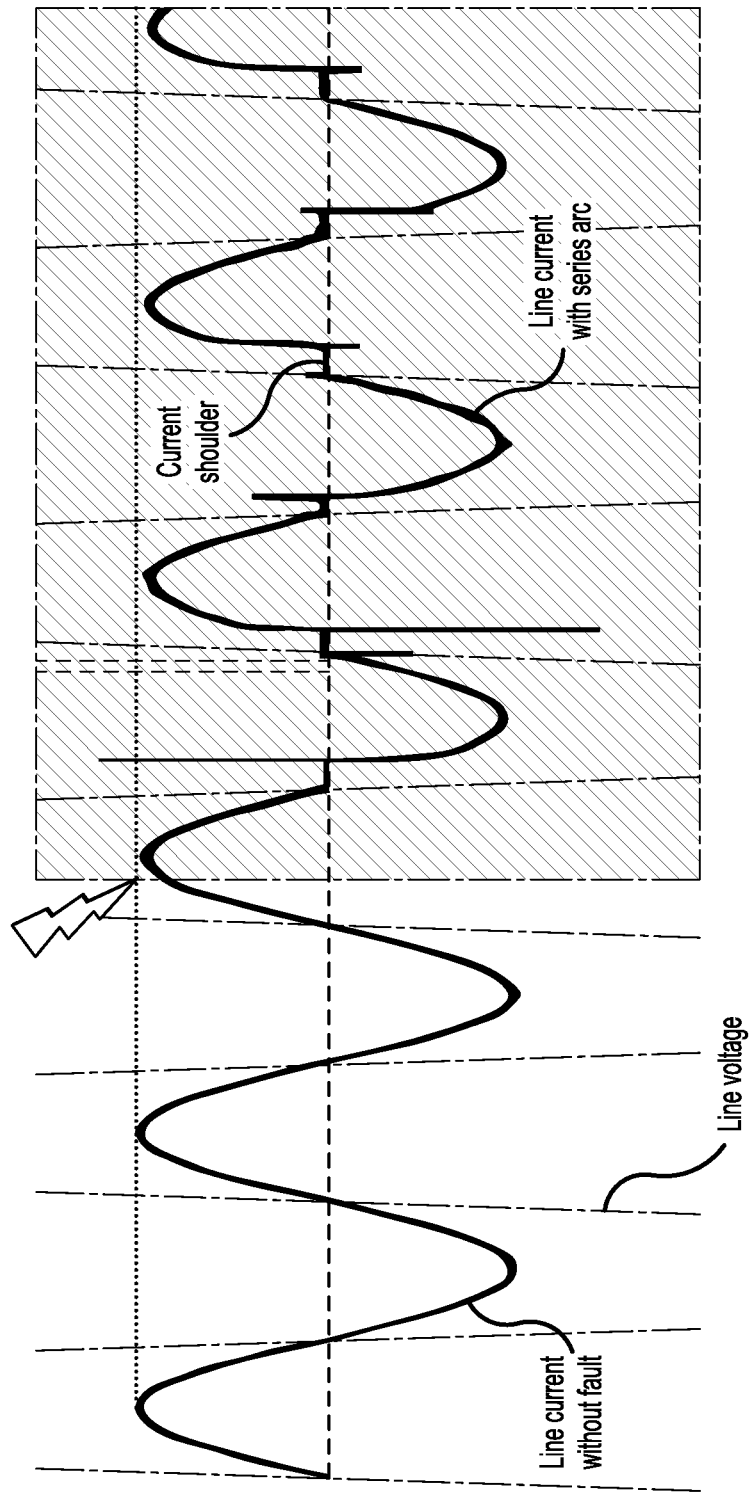
FIG. 4 represents an electrical quantity reading highlighting the impact of an alternating current on the behavior of an arc.

The curves represented in FIG. 4 illustrate an acquisition before and during a series arc on an AC voltage network, and represent the line voltage and the line current.

The left part of the curve represents these two measurements at rated speed on a loaded line. The right part of the curve is impacted by a series electric arc (symbolized by a lightning bolt).

At each half period, the series arc is identifiable on the current curve by:
- A low current drop: identifiable via the difference (dotted line) between the top of the sinusoids before and during the arc,
- A current shoulder at 0 A corresponding to the breaking of the arc due to the voltage drop of the line, The reflectometry measures the local impedance mismatches.

The measurement of a series arc by reflectometry results in the creation of a positive peak of amplitude impedance mismatches on a reflectogram. This is also the case for an open circuit, but the amplitude obtained in this case is much greater. Indeed, the series arc adds very low series impedance on the circuit. The open circuit adds very large impedance, resulting in a very large impedance variation compared to that of the series arc.

As seen previously, the current shoulders are the consequence of the breaking of the arc and the very brief switching to open circuit. This consequence is therefore favorable to the detection of the series arc by MCTDR reflectometry, which is particularly interesting for a detection at these times.

High Frequency patterns are therefore transmitted around the transition of the voltage to 0V: at this moment, the impedance mismatch peaks are maximum.

More specifically in the case of measurement by reflectometry, the system performs an average of Q patterns. It is then necessary to make sure that at least 1 of the Q patterns is sent when the line voltage is 0V.

The advantage of the reflectometry is that it is capable of making the difference between:
- the transition of the current to 0 A related to a series arc—consequence of an open circuit;

the normal behavior of a load having, on the evolution of the current, 0 A transitions at each half-period (example: diode rectifier load);

no open circuit on the 0 A transitions—no risk of false detection.

The invention claimed is:

1. A device for detecting and locating by reflectometry an arc in an electric circuit of an aeronautical system, including:
 a coupling element configured to transmit an electrical signal in the circuit and to acquire a signal passing through the circuit;
 a high-pass filter having a cut-off frequency between 100 kHz and 1 GHz, the high-pass filter being configured to block the frequencies lower than the cut-off frequency;
 a correlation chip able to control the coupling element and the high-pass filter, the correlation chip including a memory in which code data are stored,
wherein the code data, when executed,
Cause:
 the coupling element to transmit a multi-carrier time domain reflectometry signal, MCTDR, in a line of the circuit and to acquire an electrical quantity of the reflected signal passing through the network;
 the high-pass filter to filter the acquired signal so as to eliminate signals having a frequency lower than the cut-off frequency;
 the correlation chip to compare the acquired signal with a first and a second threshold, the first and the second threshold being of different signs.

2. The device according to claim 1, wherein the high-pass filter is disposed between the line and the other elements of the device.

3. The device according to claim 1, wherein the high-pass filter and the coupling element are produced by means of a single capacitive coupling.

4. The device according to claim 1, wherein the first threshold has a value between 0 and the negative of the second threshold.

5. The device according to claim 1, wherein the code data, when executed, cause the coupling element to transmit a multi-carrier time domain reflectometry signal which includes frequencies greater than the cut-off frequency.

6. Device according to claim 1, wherein the circuit is supplied with an AC voltage signal in which the voltage assumes a zero value at each period, and wherein the code data, when executed, cause the coupling element to transmit the multi-carrier time domain reflectometry signal with at least one high-frequency pattern when the voltage assumes a zero value.

* * * * *